United States Patent
Hsing et al.

(10) Patent No.: US 8,281,199 B2
(45) Date of Patent: Oct. 2, 2012

(54) HYBRID SELF-TEST CIRCUIT STRUCTURE

(75) Inventors: Yu-Tsao Hsing, Hsinchu (TW); Li-Ming Teng, Hsinchu (TW)

(73) Assignee: Hoy Technologies, Co., Ltd., Hsinchu (TW)

( * ) Notice: Subject to any disclaimer, the term of this patent is extended or adjusted under 35 U.S.C. 154(b) by 264 days.

(21) Appl. No.: 12/772,407

(22) Filed: May 3, 2010

(65) Prior Publication Data

US 2011/0267071 A1    Nov. 3, 2011

(51) Int. Cl.
*G11C 29/00* (2006.01)
*G01R 31/28* (2006.01)
*G01R 31/3187* (2006.01)

(52) U.S. Cl. ...... 714/733; 714/718; 714/734; 324/750.3

(58) Field of Classification Search ........................ None
See application file for complete search history.

(56) References Cited

U.S. PATENT DOCUMENTS

| | | | | |
|---|---|---|---|---|
| 5,968,192 | A * | 10/1999 | Kornachuk et al. | 714/724 |
| 6,374,370 | B1 * | 4/2002 | Bockhaus et al. | 714/39 |
| 6,560,740 | B1 * | 5/2003 | Zuraski et al. | 714/733 |
| 7,360,116 | B2 * | 4/2008 | Nakamura | 714/30 |
| 2004/0006729 | A1 * | 1/2004 | Pendurkar | 714/733 |
| 2007/0168803 | A1 * | 7/2007 | Wang et al. | 714/726 |
| 2008/0126892 | A1 * | 5/2008 | Dubey et al. | 714/718 |

* cited by examiner

*Primary Examiner* — Guerrier Merant
(74) *Attorney, Agent, or Firm* — Bacon & Thomas, PLLC (57) ABSTRACT

A hybrid self-test circuit structure comprises a plurality of input terminals and a plurality of output terminals for testing a plurality of memory units. The circuit structure comprises a first level functional unit for driving a plurality of first output terminals electrically coupled to the first level functional unit to output an output signal according to an external control signal transmitted from the outside; a plurality of second level functional units for receiving the output signal and generating a test signal according to the output signal and outputting the test signal to the memory units; a parallel interface parallelly installed between the first level functional unit and at least one of the second level functional units; and a serial interface serially installed between the first level functional unit and at least one of the second level functional units.

10 Claims, 8 Drawing Sheets

HYBRID SELF-TEST CIRCUIT STRUCTURE

FIELD OF THE INVENTION

The present invention relates to a self-test circuit structure of a memory unit, in particular to a hybrid self-test circuit structure having a parallel interface and a serial interface electrically coupled to a plurality of level functional units.

BACKGROUND OF THE INVENTION

Conventionally, embedded self-test circuit architecture is adopted for testing memory units, wherein a large quantity of control signal lines and data bus lines are used for transmitting signals, issuing instructions or performing operations. Although the aforementioned parallel architecture can achieve the effect of sending out an access instruction in every clock cycle to perform an full-speed test to the memory units. If the quantity of testing memory units becomes larger, the control signal lines and the data bus lines will increase the wiring area greatly during a chip design process, and the increased wiring area will incur a higher cost, particularly for the advanced manufacturing process <65 nm, having a more significant increase of the wiring area and incurring a much higher cost.

To overcome the aforementioned problems, some manufacturers adopt the serial method to solve the increased wiring area problem and lower the cost. For example, a serial standard such as IEEE 1149.1 or IEEE 1500 is adopted. Although the wiring area can be reduced, the serial method requires executing several instructions in a time period, while the parallel method only requires executing one instruction to complete the transmission of instructions or data, so that the testing time will be increased significantly. In other words, the time and cost are increased, and such increase makes the self-test circuit unable to support the full-speed test function which is an important test for testing the fault coverage of the memory units. If only the serial method is used for the testing, the issue of the wiring cost can be solved, but the memory units cannot be tested effectively.

SUMMARY OF THE INVENTION

One objective of the present invention to provide a hybrid self-test circuit structure simultaneously having a parallel interface and a serial interface (or sequential interface) electrically coupled between n pieces of level functional units and provided for optimizing a circuit layout of a substrate, as well as providing a high efficiency of testing, diagnostic and repair for testing the memory units.

Another objective of the present invention is to provide a hybrid self-test circuit structure having a parallel interface, a serial interface or a daisy chair interface electrically coupled between n pieces of level functional units or functional units at the same level and provided for optimizing a circuit layout of a substrate, as well as providing a high efficiency of testing, diagnostic and repair for testing the memory unit.

A further objective of the present invention is to provide a hybrid self-test circuit structure, wherein n pieces of level functional units installed in the circuit structure are electrically coupled with each other by a parallel interface, a serial interface, a daisy chair interface, or a combination of any two or more of the above, and provided for optimizing a circuit layout of a substrate, as well as providing a high efficiency of testing, diagnostic and repair for testing the memory units.

To achieve the foregoing and other objectives, the present invention provides a hybrid self-test circuit structure having a plurality of input terminals and a plurality of output terminals for testing a plurality of memory units. The hybrid self-test circuit structure comprises a first level functional unit, a plurality of second level functional units, a parallel interface and a serial interface. The first level functional unit is electrically coupled to at least one of the input terminals and at least one of the output terminals, and the first level functional unit includes a plurality of first output terminals for driving the first output terminal to output an output signal according to an external control signal transmitted from the input terminal, and the second level functional units respectively include a plurality of second input terminals for receiving the output signal, and the second level functional unit generates a test signal according to the output signal, and the test signal is outputted to the memory units through at least one of the output terminals electrically coupled to the second level functional unit, and the parallel interface is installed in parallel between the first level functional unit and at least one of the second level functional units and provided for parallelly transmitting the output signal to the second level functional units; and the serial interface is serially installed between the first level functional unit and at least one of the second level functional units and provided for serially transmitting the output signal to the second level functional units.

Compared with the prior art, the hybrid self-test circuit structure of the present invention utilize a hybrid parallel interface and serial interface architecture for reducing the wiring area required for the circuit layout of the chip, providing a high-speed testing and diagnostic for testing the memory units, and diagnosing and repairing the memory units having an abnormal signal. The present invention further achieves the effect of minimizing the testing cost of the testing circuit of the memory units.

To make it easier for the examiner to understand the objects, characteristics and effects of this invention, we use preferred embodiments together with the attached drawings for the detailed description of the invention as follows.

DESCRIPTION OF THE PREFERRED EMBODIMENTS

The objects, characteristics and effects of the present invention will become apparent with the detailed description of preferred embodiments and the illustration of related drawings as follows.

Figure 1:
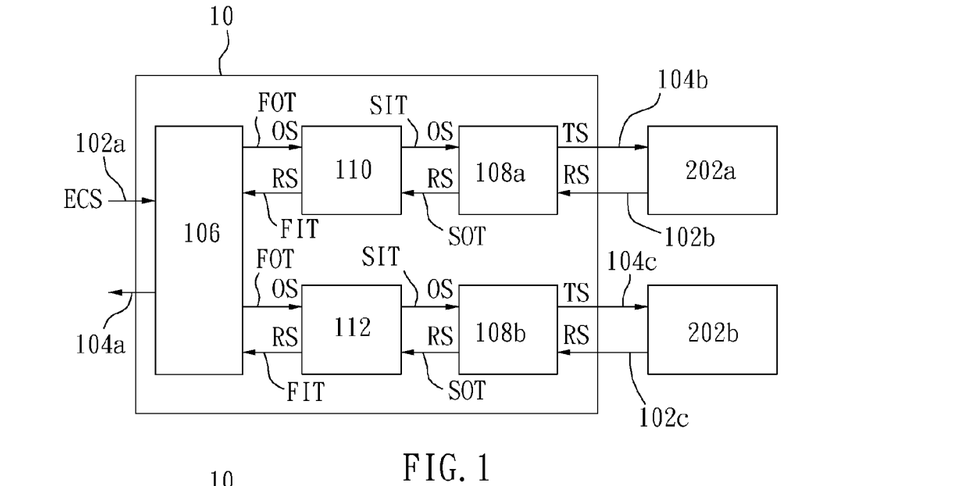
FIG. 1 is a schematic block diagram of a hybrid self-test circuit structure in accordance with a preferred embodiment of the present invention.

With reference to FIG. 1 for a schematic block diagram of a hybrid self-test circuit structure in accordance with a preferred embodiment of the present invention, the hybrid self-test circuit 10 comprises a plurality of input terminals 102a~102c and a plurality of output terminals 104a~104c for testing a plurality of memory units 202a, 202b. The hybrid self-test circuit 10 further comprises a first level functional unit 106, a plurality of second level functional units 108a, 108b, a parallel interface 110 and a serial interface 112. The first level functional unit 106 includes a first output terminal FOT, and the input terminal 102a is provided for receiving an external control signal ECS transmitted from the outside, and the first level functional unit 106 is provided for generating and outputting an output signal OS according to the external control signal ECS. The external control signal ECS (instruction or algorithm) can be an external control signal and an external data signal, provided for transmitting a control signal and a data signal respectively, and the control signal also includes a read control signal, a write control signal, a synchronous signal or a chip select signal, and the data signal also includes a memory address signal and a data test signal. Each second level functional unit 108a, 108b includes a second input terminal SIT, and the second level functional unit 108a, 108b generates a test signal TS according to the output signal OS, and the test signal TS is outputted to the memory unit 202a, 202b through the output terminal 104b, 104c for testing the memory unit 202a, 202b. The parallel interface 110 is parallelly installed between the first level functional unit 106 and at least one of the second level functional units 108a, 108b, and provided for parallelly transmitting the output signal OS to the second level functional unit 108a, 108b. The serial interface 112 is serially installed between the first level functional unit 106 and at least one of the second level functional units 108a, 108b, and provided for serially transmitting the output signal OS to the second level functional unit 108a, 108b.

In addition, the first level functional unit 106 and the second level functional unit 108a, 108b further include a first input terminal FIT and a second output terminal SOT respectively. The memory unit generates a result signal RS according to the test signal TS, and the result signal RS is transmitted to the second level functional unit 108a, 108b through the input terminal 102b, 102c of the hybrid self-test circuit 10 and outputted from the second output terminal SOT of the second level functional unit 108a, 108b to the parallel interface 110 and the serial interface 112, and then inputted from the first input terminal FIT of the first level functional unit 106 to the first level functional unit 106. Thereafter, the output terminal 104a of the hybrid self-test circuit 10 outputs the result signal RS. In other words, the memory unit 202a, 202b generates the result signal RS corresponding to the test signal TS, and the result signal RS is returned to the output terminal 104a through the input terminal 102b, 102c, the second output terminal SOT and the first input terminal FIT.

Figure 2:
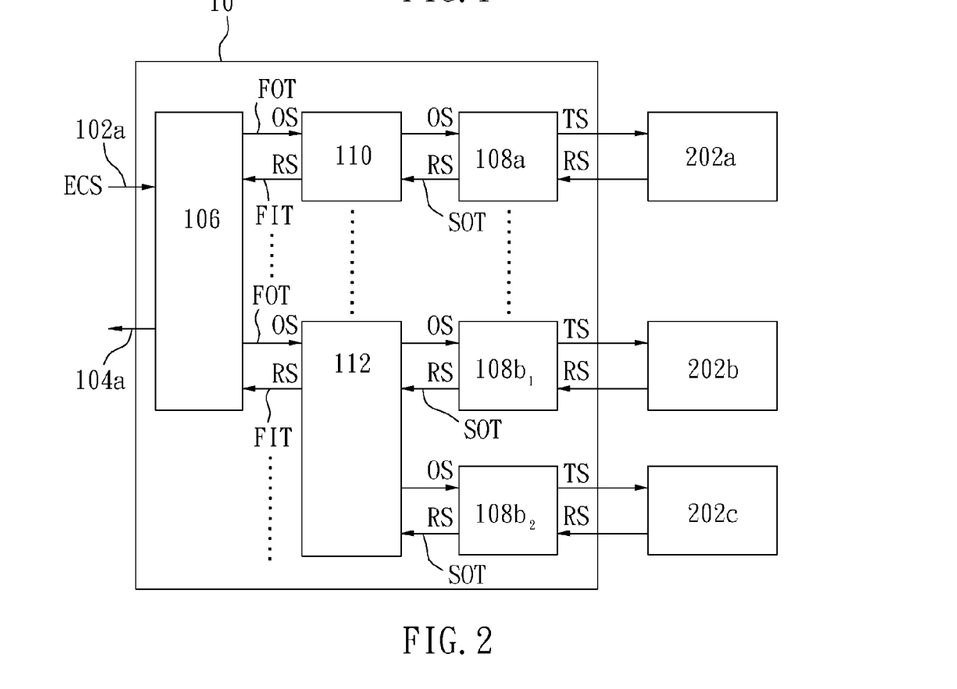
FIG. 2 is a schematic view of at least one portion of second level functional units being electrically coupled to each other by a daisy chain interface in accordance with the present invention.
Figure 3:
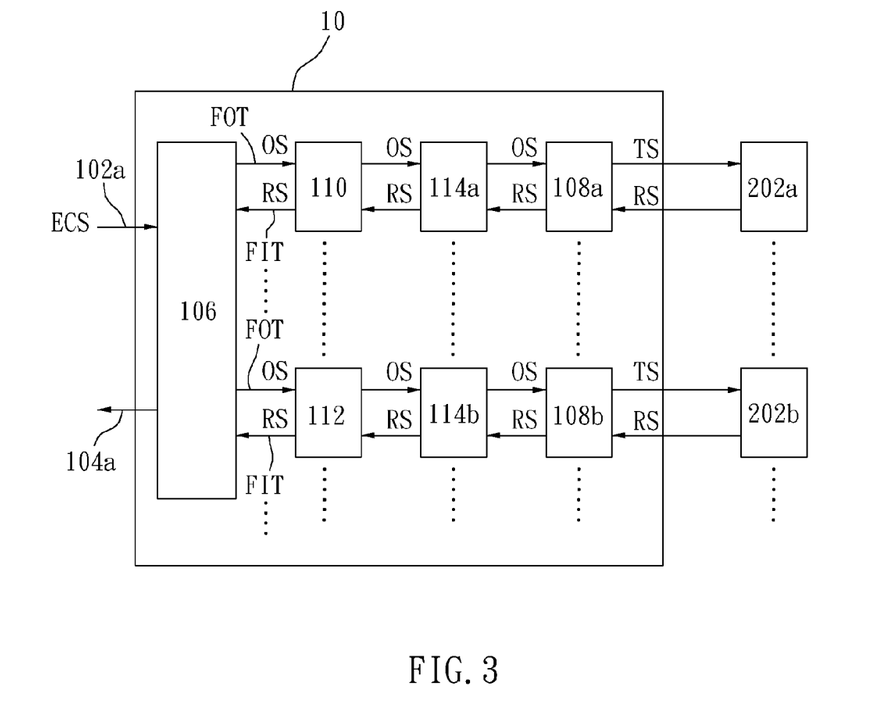
FIG. 3 is a schematic view of electrically coupling multi-level functional units in accordance with the present invention.

It is understand that at least one portion of the second level functional units $108b_1$, $108b_2$ as shown in FIG. 2 are electrically coupled with each other by a daisy chain interface. In addition, the persons ordinarily skilled in the art can understand that the two-level functional unit in accordance with this preferred embodiment can be a multi-level or (n-level) functional unit as shown in FIG. 3 for performing a multiplex processing of signals. The hybrid self-test circuit structure 10 further comprises a plurality of $n^{th}$ level functional units installed between the first level functional unit 106 and the second level functional unit 108a, 108b, and at least one of the $n^{th}$ level functional units is electrically coupled to the first level functional unit 106 and the second level functional units 108a, 108b through the parallel interface 110 and/or the serial interface 112. In addition, at least a portion of the $n^{th}$ level functional units are electrically coupled with each other by a daisy chair interface.

Figure 4:
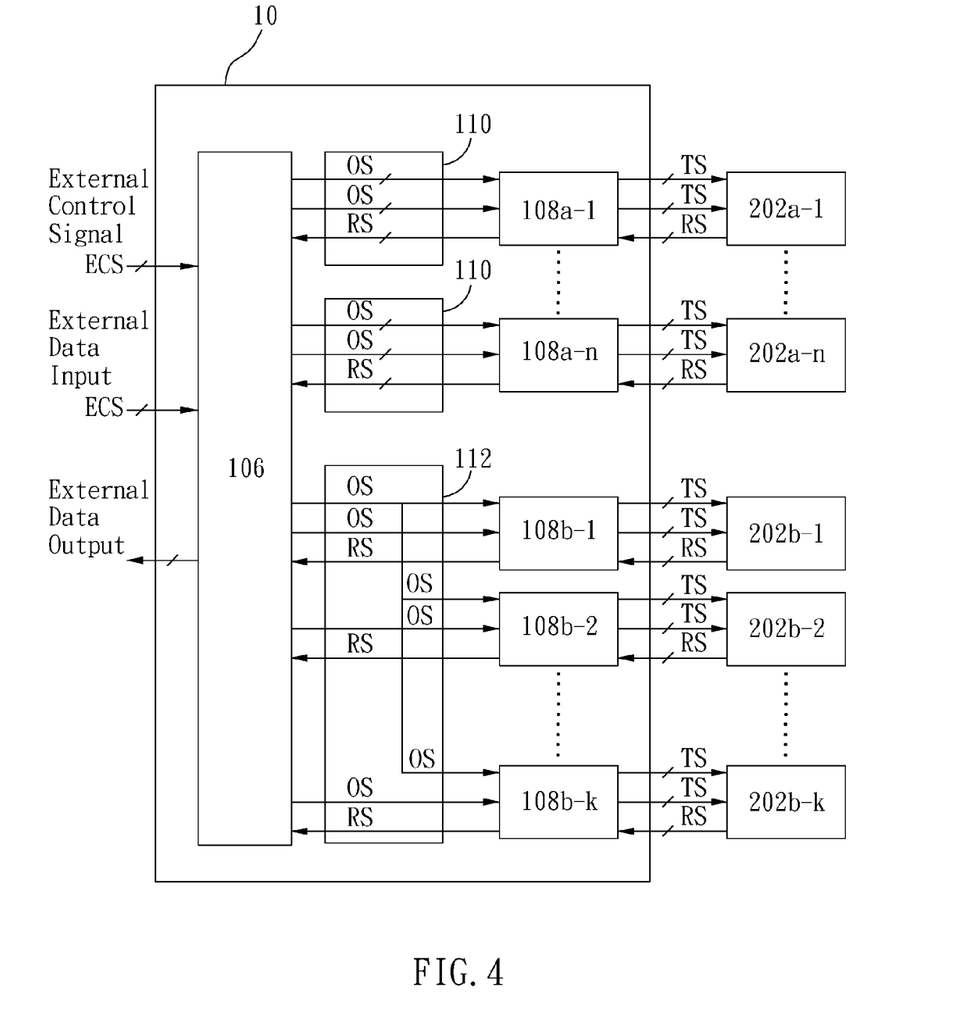
FIG. 4 is a schematic view of a serial and parallel hybrid two-level architecture of a hybrid self-test circuit structure in accordance with another preferred embodiment of the present invention.

With reference to FIG. 4 for a schematic view of a serial and parallel hybrid two-level architecture of a hybrid self-test circuit structure in accordance with another preferred embodiment of the present invention, the hybrid self-test circuit structure 10 adopting a two-level functional unit architecture comprises a first level functional unit 106, a plurality of second level functional units 108a-1~108b-k, a parallel interface 110 and a serial interface 112. The first level functional unit 106 and the second level functional units 108a-1~108b-k are electrically coupled through the parallel interface 110 and the serial interface 112. The self-test circuit structure 10 provides an input terminal 102a for receiving an external control signal ESC from the outside, wherein the external control signal ESC includes an external control signal and an external data input signal, and the first level functional unit 106 is provided for forming an output signal OS. The output signal OS is electrically coupled to the second level functional unit 108a-1~108b-k through the parallel interface 110 and the serial interface 11. It is understand that a portion of the output signals OS are transmitted to the second level functional unit 108b-1~108b-k by the serial interface 112, and another portion of output signals OS are transmitted to the second level functional unit 108a-1~108a-k by a parallel interface, and both can share the hardware resources of the first level functional unit 106 at the same time. In addition to sharing the output signal OS of the serial interface 112, the second level functional units 108b-1~108b-k have independent serial input and output for communicating with the first level functional unit 106, and a parallel interface is used between the self-test circuit structure 10 and the memory unit 202 for performing a read operation to the memory unit. In addition, a serial interface can also be used in other embodiments.

Figure 5:
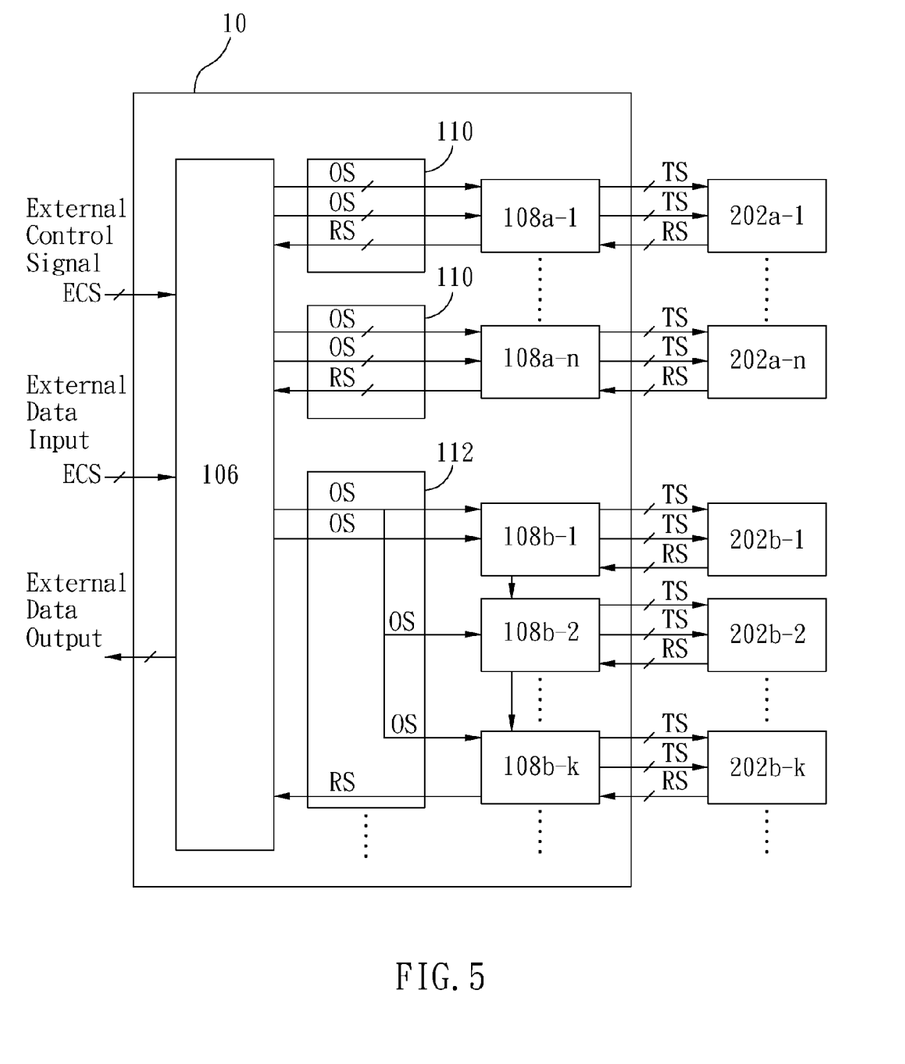
FIG. 5 is a schematic view of a serial interface, daisy chair interface and parallel interface hybrid two-level architecture of a hybrid self-test circuit structure in accordance with the present invention.

With reference to FIG. 5 for a serial interface, daisy chair interface and parallel interface hybrid two-level architecture of a hybrid self-test circuit structure in accordance with the present invention, the second level functional units 108b-1~108b-k of the hybrid self-test circuit structure 10 are electrically coupled with each other by a daisy chair interface. In addition to sharing the output signal OS, the second level functional units 108b-1~108b-k form a daisy chain from the input and output of a serial interface, and only the second level functional units 108b-k are used for transmitting data back to the first level functional unit 106. In other embodiments, the first level functional unit 106 can have the architecture of several daisy chair interfaces instead of the architecture of one daisy chair interface only.

Figure 6:
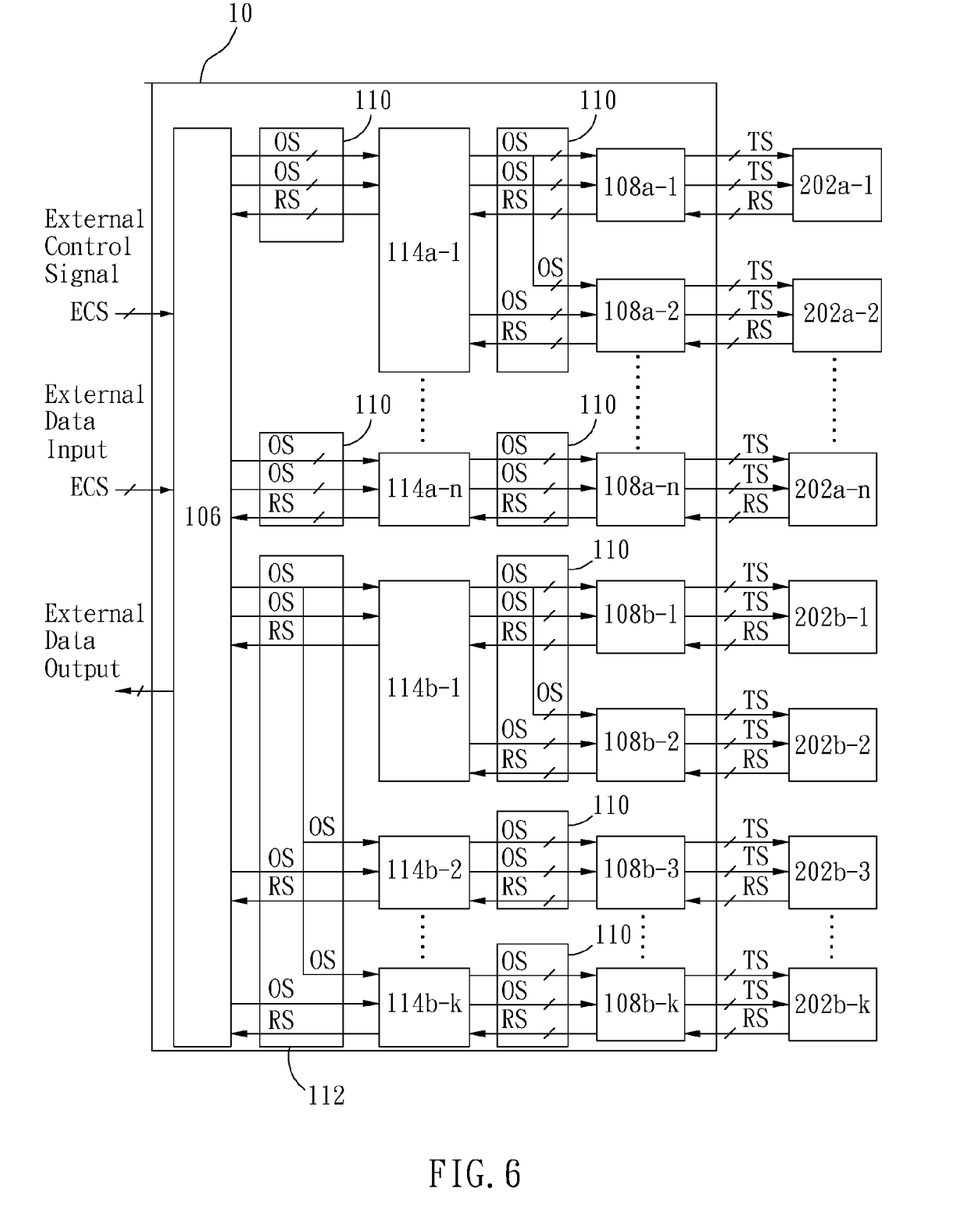
FIG. 6 is a schematic view of a serial and parallel hybrid three-level architecture of a hybrid self-test circuit structure in accordance with another preferred embodiment of the present invention.
Figure 7:
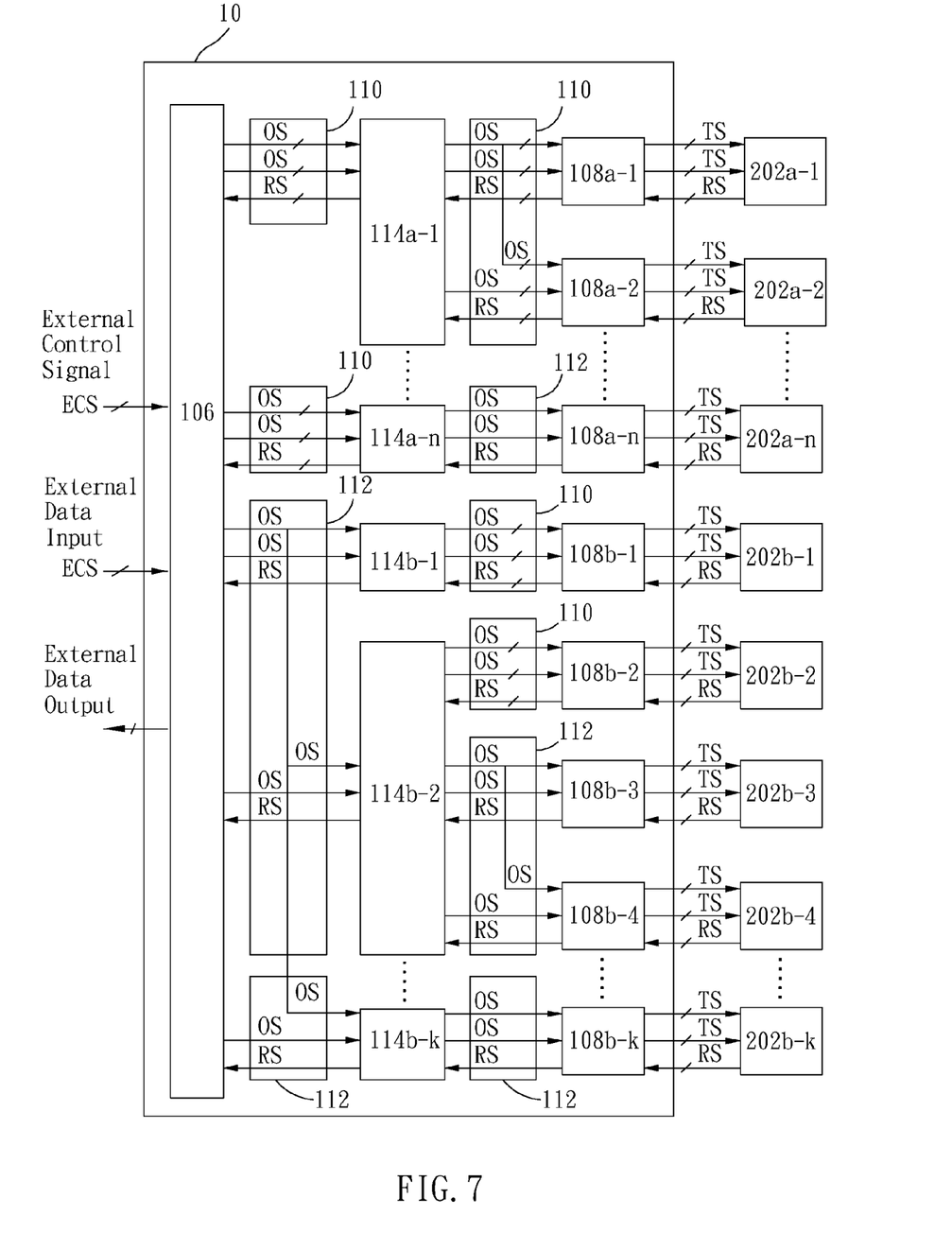
FIG. 7 is a schematic view of a hybrid three-level architecture in accordance with another preferred embodiment of the present invention.
Figure 8:
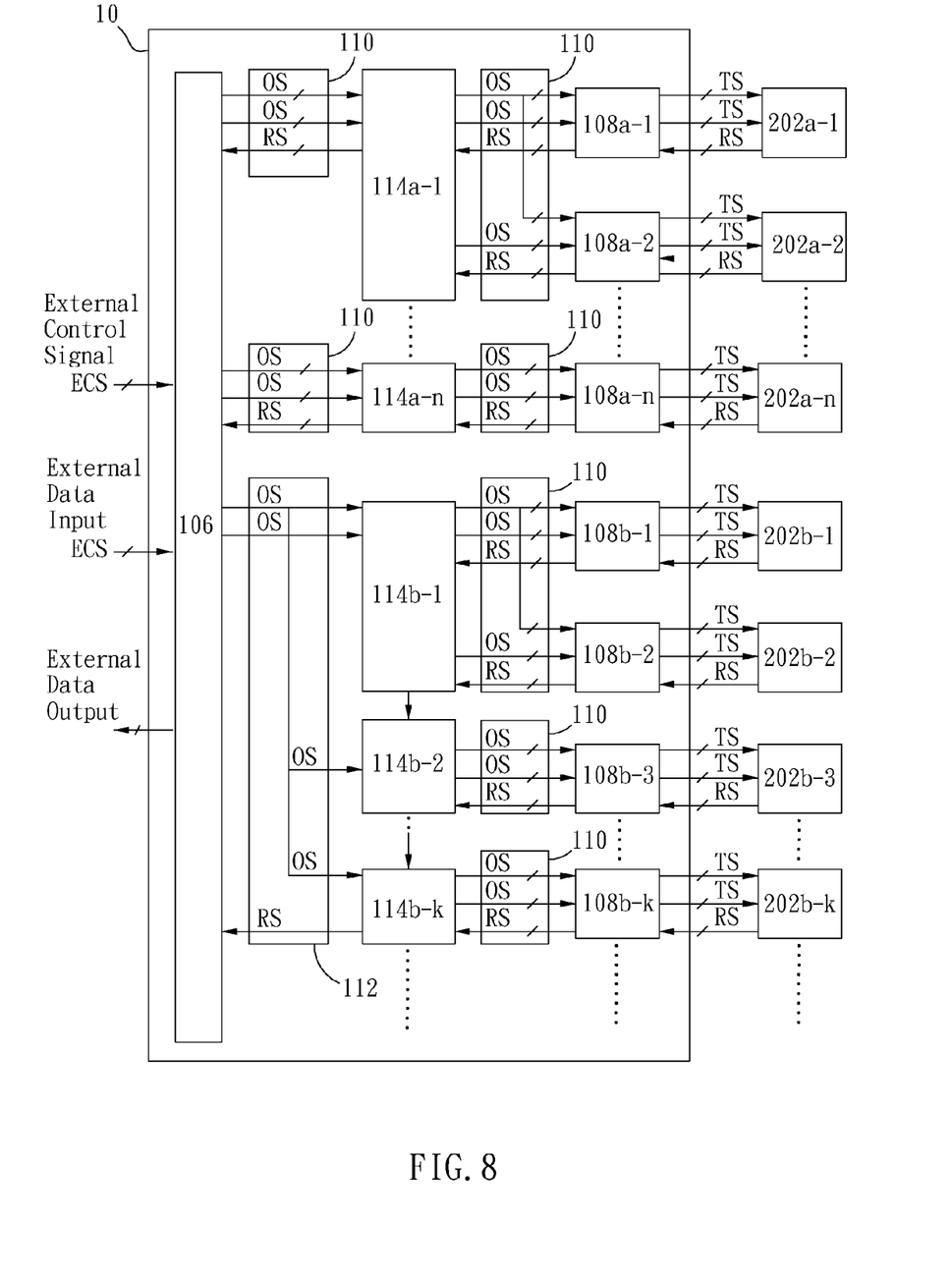
FIG. 8 is a schematic view of a serial interface, daisy chair interface and parallel interface hybrid three-level architecture of a hybrid self-test circuit structure in accordance with another preferred embodiment of the present invention.
Figure 9:
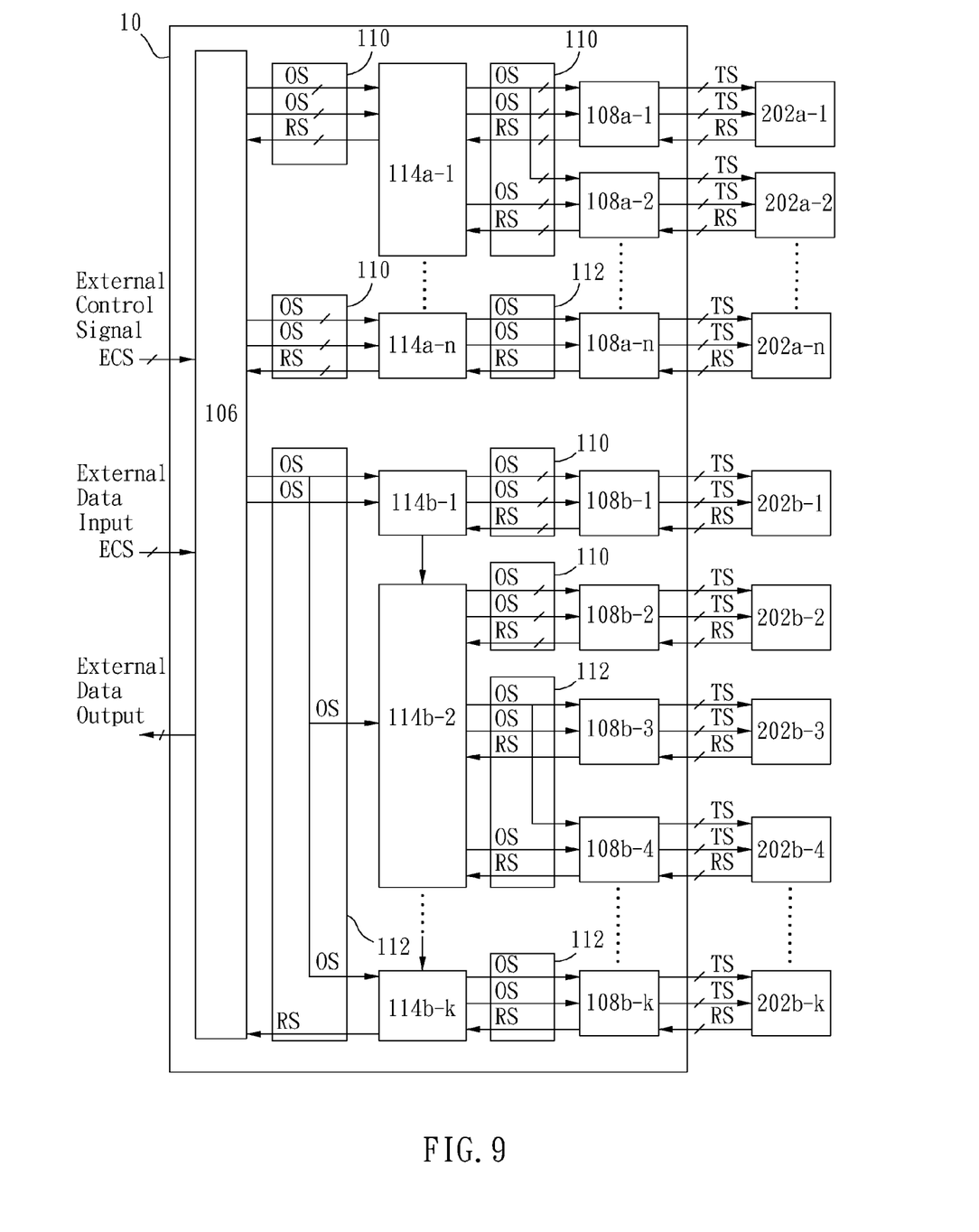
FIG. 9 is a schematic view of a serial interface, daisy chair interface and parallel interface hybrid three-level architecture in accordance with another preferred embodiment of the present invention.

With reference to FIG. 6 for a schematic view of a serial and parallel hybrid three-level architecture of a hybrid self-test circuit structure in accordance with another preferred embodiment of the present invention, the hybrid self-test circuit structure 10 further include third level functional units 114a-1~114b-k, and their operation is described as follows. With reference to FIG. 7 for a serial and parallel hybrid three-level architecture of another preferred embodiment of, FIG. 8 for a serial interface, daisy chair interface and parallel hybrid three-level architecture, and FIG. 9 for a serial interface, daisy chair interface and parallel interface hybrid three-level architecture, the number of third level functional units 114a-1~114b-k in the aforementioned hybrid self-test circuit structure 10 is not necessary to be corresponding to the number of second level functional units 108a-1~108b-k. In other words, the present invention is not limited to one or more functional units corresponding to one or more of other functional units. For example, the third level functional units 114a-1 as shown in FIGS. 6 to 9 correspond to the second level functional units 108a-1 and 108a-2 at the same time, and the third level functional units 114a-n correspond to the second level functional units 108a-n only.

Compared with the prior art, the hybrid self-test circuit structure of the present invention utilize a hybrid architecture with a parallel interface, a serial interface, a daisy chair interface or their combination to achieve the effects of reducing the wiring area for the circuit layout of a chip, and providing a high-speed testing and diagnostic to diagnose and repair the memory unit having an abnormal signal, so as to minimize the testing cost for testing the memory unit by the testing circuit.

While the invention has been described by means of specific embodiments, numerous modifications and variations could be made thereto by those skilled in the art without departing from the scope and spirit of the invention set forth in the claims.

What is claimed is:

1. A hybrid self-test circuit structure, having a plurality of input terminals and a plurality of output terminals, for testing a plurality of memory units, and the structure comprising:
   a first level functional unit, electrically coupled to at least one of the input terminals and at least one of the output terminals, and the first level functional unit having a plurality of first output terminals, and provided for outputting an output signal from the first output terminals according to an external control signal transmitted from the input terminals;
   a plurality of second level functional units, having a plurality of second input terminals, for receiving the output signal, and the second level functional units generating test signals according to the output signals respectively, and the test signals being outputted to the memory units through at least one of the output terminals electrically coupled to the second level functional units;
   a parallel interface, parallelly installed between the first level functional unit and at least one of the second level functional units, and provided for parallelly transmitting the output signal to the second level functional units; and
   a serial interface, serially installed between the first level functional unit and at least one of the second level functional units, and provided for serially transmitting the output signal to the second level functional units;
   wherein the first level functional unit simultaneously cooperating with the parallel interface and the serial interface;
   wherein the hybrid self-test circuit structure simultaneously having the parallel interface and the serial interface electrically coupled between the first and second level functional units to reduce a wiring area for a circuit layout of a chip and to provide a high-speed testing and diagnostic.

2. The hybrid self-test circuit structure according to claim 1, wherein the first level functional unit and the second level functional units further include a plurality of first input terminals and a plurality of second output terminals respectively.

3. The hybrid self-test circuit structure according to claim 2, wherein the memory units generate a result signal corresponding to the test signal, and returns the result signal to the output terminal through the input terminal, the second output terminals and the first input terminals.

4. The hybrid self-test circuit structure according to claim 3, wherein the input terminal receives an external control signal, an external data signal or the result signal.

5. The hybrid self-test circuit structure according to claim 1, wherein at least a portion of the second level functional units are electrically coupled to each other by a daisy chain interface.

6. The hybrid self-test circuit structure according to claim 1, further comprising a plurality of nth level functional units are installed between the first level functional unit and the second level functional units, and at least one of the nth level functional units are electrically coupled with the first level functional unit and the second level functional units by the parallel interface and/or the serial interface.

7. The hybrid self-test circuit structure according to claim 6, wherein at least a portion of the nth level functional units are electrically coupled with each other by a daisy chain interface.

8. The hybrid self-test circuit structure according to claim 6, wherein at least one of the nth level functional units simultaneously cooperates with the parallel interface and the serial interface.

9. The hybrid self-test circuit structure according to claim 5, wherein the second level functional units electrically coupled to each other by a daisy chain interface have a plurality of independent serial outputs for respectively transmitting a plurality of result signals generated by the memory units to the first level functional unit.

10. The hybrid self-test circuit structure according to claim 5, wherein one of the second level functional units electrically coupled to each other by a daisy chain interface transmits a result signal generated by the memory units to the first level functional unit.

* * * * *